United States Patent [19]

McConnell

[11] Patent Number: 4,856,544

[45] Date of Patent: Aug. 15, 1989

[54] VESSEL AND SYSTEM FOR TREATING WAFERS WITH FLUIDS

[75] Inventor: Christopher F. McConnell, Gulph Mills, Pa.

[73] Assignee: CFM Technologies, Inc., Lionville, Pa.

[21] Appl. No.: 125,245

[22] Filed: Nov. 25, 1987

Related U.S. Application Data

[63] Continuation of Ser. No. 747,895, Jun. 24, 1985, Pat. No. 4,738,272, and a continuation-in-part of Ser. No. 612,355, May 21, 1984, Pat. No. 4,577,650.

[51] Int. Cl.$^4$ .............................................. B08B 3/04
[52] U.S. Cl. ...................................... 134/95; 134/102
[58] Field of Search .................. 134/25.4, 25.5, 33, 134/59, 84, 88, 89, 92, 95, 102, 114, 115 R, 155, 158, 201; 354/315, 325, 326, 337, 340, 344; 118/428, 500, 733; 206/454, 509; 211/41; 156/345; 220/4 C, 4 D; 366/336-339

[56] References Cited

U.S. PATENT DOCUMENTS

| | | | |
|---|---|---|---|
| 1,040,463 | 10/1982 | Tokheim . | |
| 2,706,992 | 4/1955 | Friedman et al. | 134/140 |
| 2,959,151 | 11/1960 | Ehrlich | 118/429 |
| 2,961,354 | 11/1960 | Cleveland | 134/1 |
| 3,276,458 | 10/1966 | Iversen et al. | 134/57 |
| 3,285,458 | 11/1966 | Wojciechowski | 220/4 |
| 3,343,812 | 9/1967 | Moulton | 259/2 |
| 3,392,780 | 7/1968 | Brown | 118/429 |
| 3,443,991 | 5/1969 | Kremm | 134/3 |
| 3,469,686 | 9/1969 | Gutsche et al. | 206/65 |
| 3,487,948 | 1/1970 | Haidegger | 211/71 |
| 3,534,862 | 10/1970 | Shambelan | 211/41 |
| 3,595,252 | 7/1971 | Conte | 134/109 |
| 3,632,462 | 1/1972 | Barrington | 156/345 |
| 3,746,022 | 7/1973 | Fillion et al. | 134/141 |
| 3,760,822 | 9/1973 | Evans | 134/99 |
| 3,826,377 | 7/1974 | Bachmann | 211/41 |
| 3,834,349 | 9/1974 | Dietze et al. | 118/500 |
| 3,870,033 | 3/1975 | Faylor et al. | 126/360 |
| 3,877,134 | 4/1975 | Shanahan | 29/417 |
| 3,923,156 | 12/1975 | Wallestad | 206/454 |
| 3,926,305 | 12/1975 | Wallestad | 206/73 |
| 3,998,333 | 12/1976 | Kamada | 211/41 |
| 4,015,615 | 4/1977 | Weber et al. | 134/196 |
| 4,039,357 | 8/1977 | Bachmann et al. | 148/175 |
| 4,077,416 | 3/1978 | Johnson, Jr. et al. | 134/159 |
| 4,111,715 | 9/1978 | Sprengling et al. | 134/10 |

(List continued on next page.)

FOREIGN PATENT DOCUMENTS

| | | |
|---|---|---|
| 1282363 | 7/1972 | United Kingdom . |
| 1298006 | 11/1972 | United Kingdom . |
| 1308790 | 3/1973 | United Kingdom . |
| 1385730 | 2/1975 | United Kingdom . |

OTHER PUBLICATIONS

*Book of Semi Standards,* "Semi Specification-3", 100 mm, and 125 mm Plastic and Metal Wafer Carriers, pp. 1-9, vol. 2, Equipment Division, Semiconductor Equipment and Materials Institute, Inc., Semi 1983.
Chemineer Kenics Brochure, "Kenics Static Mixers," pp. 1-11, Chemineer, Inc.
Koch Engineering Company, Inc. Brochure, "Efficient, Maintenance-Free, In-Line Motionless Mixers," and "Our High-Capacity, Low-Pressure-Drop Dumped Packings."
Komax Systems, Inc. Brochure, "Simultaneous Division, Cross-Current and Back-Mixing."

*Primary Examiner*—Philip R. Coe
*Attorney, Agent, or Firm*—Lahive & Cockfield

[57] ABSTRACT

Disclosed is apparatus for treating semiconductor wafers with fluids. The device comprises one or more vessels having lateral walls defining open ends. The vessels are arranged serially, and the open ends are engaged with a treatment fluid inlet and a treatment fluid outlet. Wafers or a wafer carrier are introduced into the vessels for treatment. The vessels are constructed of material that is inert to the treatment fluids and designed to minimize creation of eddy currents and fluid traps. Hydraulically full fluid flow through the vessel uniformly contacts the wafers with the fluid and results in improved and more reproducible prediffusion cleaning, rinsing, etc.

5 Claims, 4 Drawing Sheets

U.S. PATENT DOCUMENTS

| | | | |
|---|---|---|---|
| 4,132,567 | 1/1979 | Blackwood | 134/1 |
| 4,153,164 | 5/1979 | Hofmeister et al. | 211/41 |
| 4,197,000 | 4/1980 | Blackwood | 354/323 |
| 4,228,902 | 10/1980 | Schulte | 211/41 |
| 4,235,650 | 11/1980 | Chang et al. | 148/189 |
| 4,246,101 | 1/1981 | Selby, III | 210/615 |
| 4,252,229 | 3/1981 | Lee | 211/41 |
| 4,280,912 | 7/1981 | Berry, III et al. | 210/662 |
| 4,282,825 | 8/1981 | Nagatomo et al. | 118/58 |
| 4,286,541 | 9/1981 | Blackwood | 118/52 |
| 4,318,749 | 3/1982 | Mayer | 134/25.4 |
| 4,321,654 | 3/1982 | Nakajo et al. | 361/396 |
| 4,328,081 | 5/1982 | Fazlin | 204/192 |
| 4,358,470 | 11/1982 | Rasmussen | 427/4 |
| 4,383,884 | 5/1983 | Rozmus | 156/642 |
| 4,395,348 | 7/1983 | Lee | 252/143 |
| 4,479,849 | 10/1984 | Frantzen | 156/640 |

VESSEL AND SYSTEM FOR TREATING WAFERS WITH FLUIDS

REFERENCE TO RELATED APPLICATION

This application is a continuation of U.S. application Ser. No. 747,895, filed June 24, 1985, and now U.S. Pat. No. 4,738,272, which is a continuation-in-part of U.S. application Ser. No. 612,355, filed May 21, 1984, and now U.S. Pat. No. 4,577,650, the disclosure of which is incorporated herein by reference.

BACKGROUND OF THE INVENTION

This invention relates to materials processing. More particularly, it relates to teatment of wafers such as semiconductor wafers with liquid or gaseous fluids.

In the process of fabricating semiconductor wafers, the need to avoid contamination by impurities takes on critical importance. Even in the "clean rooms" of semiconductor fabrication facilities contamination can arise from human contact, solvent residues and oils from various operations, metals, dust particles, organics and other materials present in processing reagents. Many of the processing steps involved in fabricating semiconductor wafers require that the wafers be exposed to a fluid, i.e., oxidizing agents, etchants, and washing and rinsing agents. In order to achieve acceptable yields, it is important that each of these steps be carried out in a manner that minimizes the potential for contamination.

Pre-diffusion cleaning is a good example of a step in the process of fabricating semiconductor wafers which must be carefully controlled to avoid contamination. Since the diffusion step in semiconductor processing is intended to "drive-in" desired dopant atoms through high temperature exposure, any contaminants left on the wafer surface after cleaning may also be driven into the wafer and can result in faulty electrical properties.

Pre-diffusion cleaning conventionally is accomplished by loading the wafers into a basket, such as the baskets described in U.S. Pat. Nos. 3,923,156 and 3,926,305, and then immersing the wafers and basket in a series of open sinks or tank baths. Usually the cleaning method involves contacting the wafers first with a strong oxidizing agent, such as sulfuric acid, rinsing with water, then contacting the wafers with an etchant, such as hydrofluoric acid, and then rinsing again. Open baths mounted in countertops pose significant safety problems to technicians who may be exposed to the active reagents or their fumes. Moreover, airborne impurities can and do contaminate the reagents and rinse water, leading to reduced semiconductor yields.

In an effort to avoid open baths, enclosed spray-cleaning devices have been proposed. These typically also incorporate spin-drying mechanisms. One example of such a spin-rinser-dryer is disclosed in U.S. Pat. No. 3,760,822. Althought this method is an improvement over immersion techniques from the standpoint of safety and airborne contaminant control, the combination of agressive chemicals and many moving parts results in substantial maintenance problems as well as particulate contamination. Moreover, these designs subject the fragile semiconductor wafers to substantial mechanical stresses.

The need for better systems for treating semiconductor wafers with fluids has become more acute as the circuit element density of solid state devices has increased. Any such system should be capable to treating large numbers of wafers at one time and should be amenable to automated operation. Moving parts and the potential for contamination should be minimized. At the same time, worker exposure to aggressive reagents and/or their fumes should be minimized. A simple, efficient system that permits the safe treatment of semiconductor wafers with fluids in an automated and totally enclosed manner would satisfy a long felt need in the industry. If such a system could improve chip yield by even a fraction of a percent, it would greatly benefit the semiconductor manufacturing industry.

SUMMARY OF THE INVENTION

It has now been discovered that a simple, efficient system for treating semiconductor wafers with fluids resides in a vessel which serves to store a plurality of the wafers while at the same time serving as the walls of a treatment fluid flow line. Such a vessel permits the fluid treatment processes to be carried out in a totally enclosed manner, thereby avoiding safety and contamination problems. Additionally, the vessel may be designed to ensure that all of the wafers are properly exposed to the fluid, turbulence or eddy currents are minimized, and pockets where residual contaminates may collect are eliminated.

Broadly, the concept of the invention is to provide a semiconductor wafer treatment vessel which may be used singly, or in series with other similar or identical vessels, to form an integral part of a wafer treatment fluid flow line. The vessels and fluid lines gaskets, connectors and other parts of the system are preferably fabricated from materials which are inert to the treatment fluid, e.g., fluorinated polymers. Furthermore, the vessels are designed to avoid any pockets or recesses where spent fluid solutes or particulates removed from one batch of the wafers may collect or be temporarily retained only to contaminate the next batch, and to avoid creation of fluid flow peculiarities which might serve to concentrate solutes. Thus, microcracks where parts join, interior acute angles and other sharp corners, and recesses are avoided so that all treatment fluid flows through the vessel and is transported away to be discarded or repurified.

The invention contemplates an automated system wherein plural vessels incorporated within a fluid flow line are loaded with wafers, or with a conventional carrier containing a plurality of wafers, e.g., through a sealable opening disposed in a lateral wall of each vessel. A series of fluid processing steps may then be carried out in sequence without the need to move the wafers from one bath to another.

In one illustrated embodiment, the invention provides a semiconductor treatment station disposed in a fluid flow line. The station comprises a single wafer vessel, or plural wafer vessels arranged serially, which consist of opposed lateral walls disposed about an axis parallel to the direction of fluid flow defining a fluid-tight compartment having opposed open ends. Each vessel includes internal structure for supporting a plurality of planar wafers, oriented with the plane of the wafers parallel to the flow axis. Preferably the wafers are contained in a wafer carrier. Each vessel has a sealable opening, defined by at least a portion of at least one of the lateral walls, which permits the introduction and withdrawal of the wafers, and may be sealed by means of a panel, door or the like. A fluid inlet is disposed at one open end of the vessel or series of vessels, and a fluid outlet is disposed at the opposite end. The inlet and outlet are connected to fluid conduits, which in turn are connected to one or more sources of treatment fluid, one or more spent fluid drains, or means for reclaiming fluids for reuse. In certain situations, sequential treatment steps may involve reversing the direction of fluid flow, in which case the inlet and outlet reverse rolls.

In preferred aspects of this illustrated embodiment, the vessels include internally disposed structure for nesting a wafer carrier in a selected position therewithin. The inlet includes an expander which expands the cross-section fluid flow from the narrow flow lines to the larger dimensions of the vessels. Thus the dimensions of the inlet and outlet are substantially coextensive with the dimensions of the open ends of the vessels. A means for imparting plug flow to a liquid introduced into the vessels through the expander to displace another liquid contained in the vessels is preferably included upstream of the expander. The plug flow imparting means preferably takes the form of a 360° helix disposed immediately upstream of the expander.

In another illustrated embodiment, each vessel defines an enclosure having lateral walls defining opposed open ends. One or more horizontal bars or other protrusions from the interior side walls of the vessel support a wafer carrier within the vessel. Optionally, the vessel includes structure for locating the wafer carrier in a selected position within the vessel. Sealing means, e.g., elastomeric gaskets, are disposed about one or both open ends of each of the vessels so that each vessel may be sealingly engaged with another, with a fluid inlet, or with a fluid outlet. The vessels may be sealed together by pneumatically compressing the elastomeric gaskets. In addition, an expander fits onto a terminal vessel and serves to expand the cross-sectional flow area of treatment fluid as it is introduced into the vessels so that each of the wafers is fully exposed. Preferably, a flow diverting surface such as a 360° helix disposed upstream of the expander is employed to aid in expansion of the cross-sectional fluid flow as it passes through the expander. This results in "plug flow" of a liquid introduced into the vessels to displace another. The opposite terminal vessel may be sealed to an extractor which serves to reduce the fluid flow from the cross-sectional dimensions of the vessels to those of the fluid flow line so that the treatment fluid can be removed while minimizing turbulent flow and eddy currents. Preferably, the apparatus is designed such that the direction of fluid flow can be reversed. In that case the expander and extractor exchange roles.

The system described above permits hydraulically full, high flow circulation, assures uniform, full contact wetting, reduces reagent consumption, prevents back eddy currents of impurities and filming effects during etching, leads to more consistent localized acid concentrations, and generally results in more consistent, uniform treatment and improved semiconductor yields. Furthermore, because the operation is totally enclosed, the intrusion of airborne contaminants and carbon dioxide is eliminated, and there is no danger of operator exposure to dangerous chemicals. Such treatment stations may be used to conduct pre-diffusion cleaning, rinsing, etching and other batch operations including drying. Furthermore, use of the invention decreases handling and permits tighter control of treatment time, temperature, and endpoint conductivity.

In view of the foregoing, it should be clear that various changes and modifications can be made in the illustrated embodiments of the invention disclosed below without departing from the spirit or scope of the invention.

BRIEF DESCRIPTION OF THE DRAWINGS

Like reference characters in the respective drawn Figures indicate corresponding parts. Some of the dimensions of the elements illustrated in the drawing have been exaggerated for purposes of more clearly explaining the nature and operation of the illustrated embodiments of the invention.

DESCRIPTION

Figures 1A, 1B, 2A, 2B:
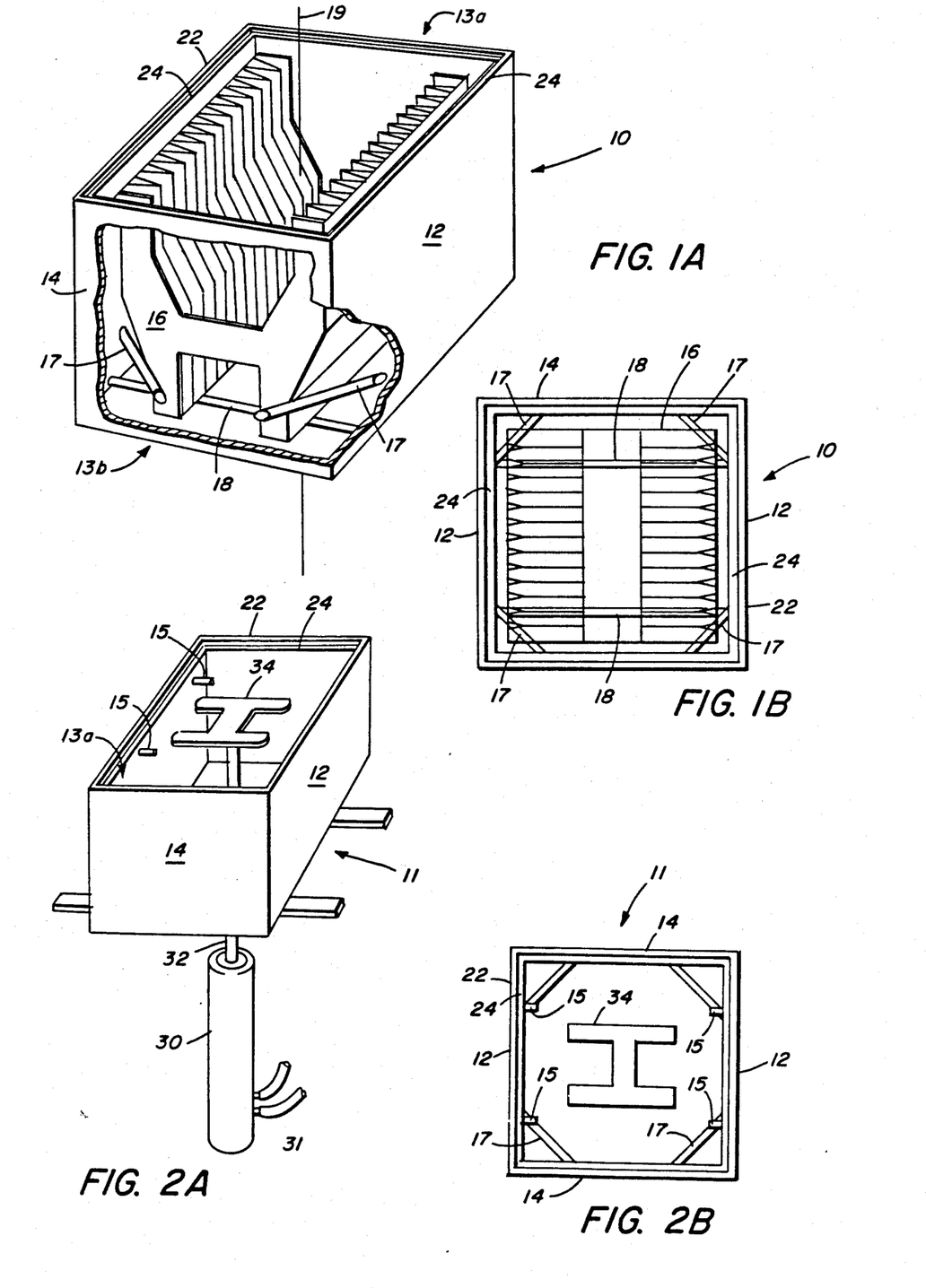
FIG. 1A is a partly broken-away, perspective view of a first embodiment of the vessel of the invention showing a wafer carrier supported and nested therein.
FIG. 1B is a top plan view of the vessel of FIG. 1A.
FIG. 2A is a perspective view of a second embodiment of the vessel of the invention showing a lift for gently nesting a wafer carrier therewithin.
FIG. 2B is a top plan view of the vessel of FIG. 2A.

Referring to FIGS. 1A, and 1B, vessels 10 are shown comprising two side walls 12 and two end walls 14. The walls define an enclosure disposed about axis 19 having a top opening 13a opposing a bottom opening 13b. Each vessel 10 also includes, for supporting and positioning a wafer carrier schematically illustrated at 16, structure comprising corner mounted positioning bars 17 and support bars 18 extending between walls 12. The surfaces of positioning bars 17 and supports bars 18 cooperate to hold the wafer carrier 16 in position. Wafer carrier 16 supports a plurality of semiconductor wafers (not shown) in aligned, parallel, spaced-apart relation to one another. the vessel and the wafer carrier for use therein will typically be designed to hold 25 wafers. The top of the vessel 10 includes a chamfered or beveled edge 22 and an elastomeric gasket 24. The beveled edge 22 and gasket 24 on the top of vessel 10 are designed to interconnect with interfitting beveled edge 26 and surface 27 on the bottom of a vessel of similar, preferably identical design, as shown in FIG. 1C.

Figure 1C:
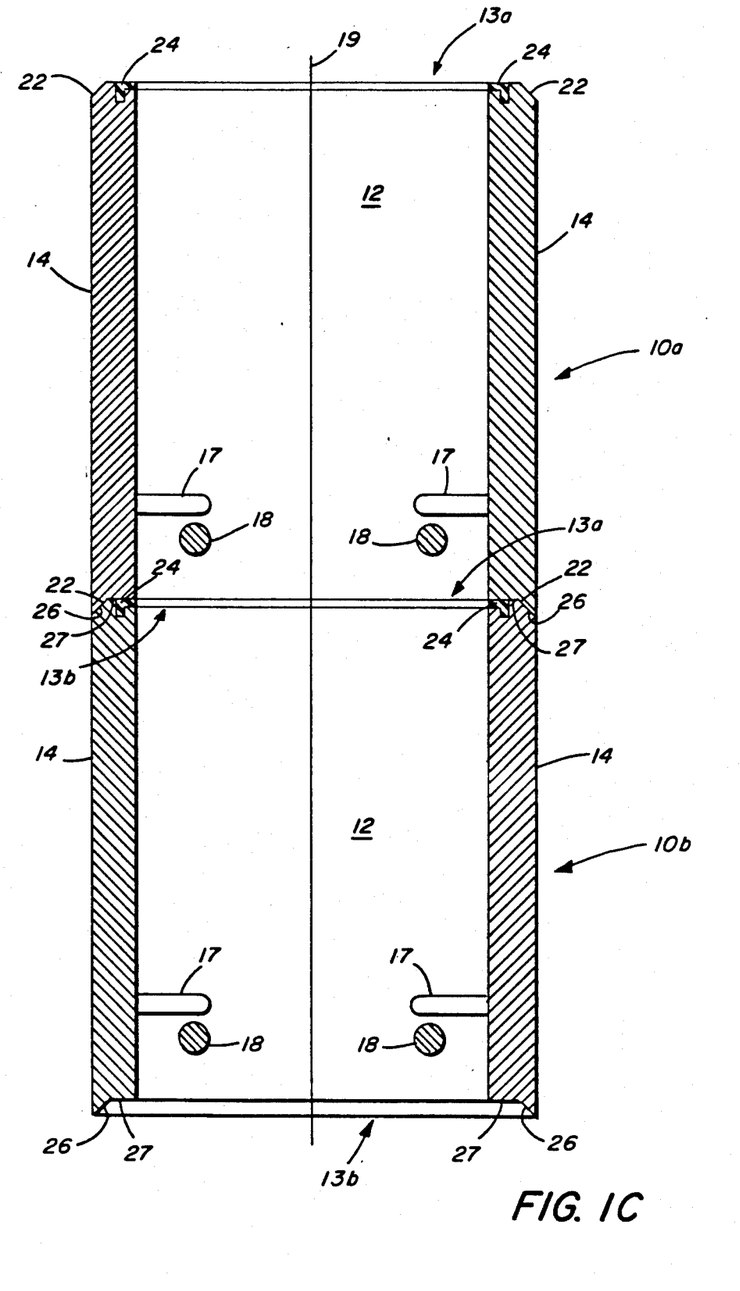
FIG. 1C is a cross-sectional view of two vessels of the type shown in FIG. 1A shown in serial, sealing engagement.

The interconnection of the vessels are illustrated in FIG. 1C, wherein two vessels 10a and 10b are shown in cross section nested together. The chamfered top edge 22 of vessel 10b and beveled bottom 26 of vessel 10a are shown in engagement. Gasket 24 is held in position by slots formed in the top of lateral walls 12 and 14. As illustrated, when two vessels such as 10a and 10b are nested together, beveled edges 22 and 26 interfit, and gasket 24 is urged against surface 27 to form a fluid-tight seal between the vessels. Preferably, the seals bulge slightly inwardly toward the wafers so that pockets where fluid might collect are eliminated.

Beveled edge 22 and gasket 24 of vessel 10a can interfit with another vessel (not shown), of the same or a different design, having an interfitting bevel and sealing surface like those illustrated at 26 and 27. Also, one or more additional vessels may be nested below vessel 10b and will have appropriate interfitting sealing means for mating with surfaces 26 and 27.

The terminal vessels in a series of nested vessels such as is depicted in FIG. 1C comprise sealing means for sealing interconnection with a wafer treatment fluid inlet and a wafer treatment fluid outlet, or structure communicating with the inlet and outlet. The seals may comprise and preferably do comprise the same structure of interfitting chamfered edges, gasket, and surfaces as are employed in interconnecting the vessels. Thus, the fluid inlet and outlet used to urge a hydraulically full flow of fluid in a direction parallel to flow axis 19 will have mating parts for sealingly engaging the assembled vessels. For example, an expander 40 (illustrated in FIG. 6) will have a lower mating edge comprising a beveled surface and a sealing surface identical to the surfaces 26 and 27 on vessel 10b of FIG. 1C. An extractor 48 (illustrated in FIG. 6) will have a upper mating edge comprising a beveled edge and gasket identical to surface 22 and gasket 24 on vessel 10b of FIG. 1C.

Although the gasket 24 is shown fixed to the top edge of the vessels 10, it should be clear that the gasket may also be carried by the bottom edge and that various other interconnecting edge arrangements can be designed by those skilled in the art. The object in any such design should be to assure sealing engagement between the mating parts and to facilitate automated loading, interfitting, and other manipulation of the vessels.

FIGS. 2A and 2B show an alternative embodiment 11 of a vessel constructed in accordance with the invention. Like the vessel of FIGS. 1A, 1B, and 1C, it comprises lateral sidewalls 12 and endwalls 14 defining an enclosure for a wafer carrier, and includes internally disposed wafer carrier positioning bars 17. However, in place of the wafer support bars extending across the internal diameter of the vessel are hanging supports 15 protruding from sidewalls 12 below the upper open end 13a of the vessel 11. These serve to support a wafer carrier containing wafers (not shown) which rests on the top surface of supports 15 and is suspended within the vessel 11.

FIGS. 2A and 2B also illustrate an exemplary device for placing a loaded wafer carrier within a vessel of the invention. It comprises a hydraulic cylinder 30, serviced by hydraulic fluid lines 31, which imparts linear motion to a hydraulic piston 32 and its associated wafer-supporting platform 34. With the piston extended as shown in FIG. 2A a wafer carrier is rested on platform 34, then cylinder 30 is actuated to lower the platform and the carrier into the vessel 11, thereby positioning the carrier between positioning bars 17 and suspending it on supports 15. After the vessel has been placed in line as disclosed hereinafter and the wafers have been treated, the carrier loaded with wafers may be removed by the hydraulic piston 32 by reversing the procedure just described.

Figure 6:
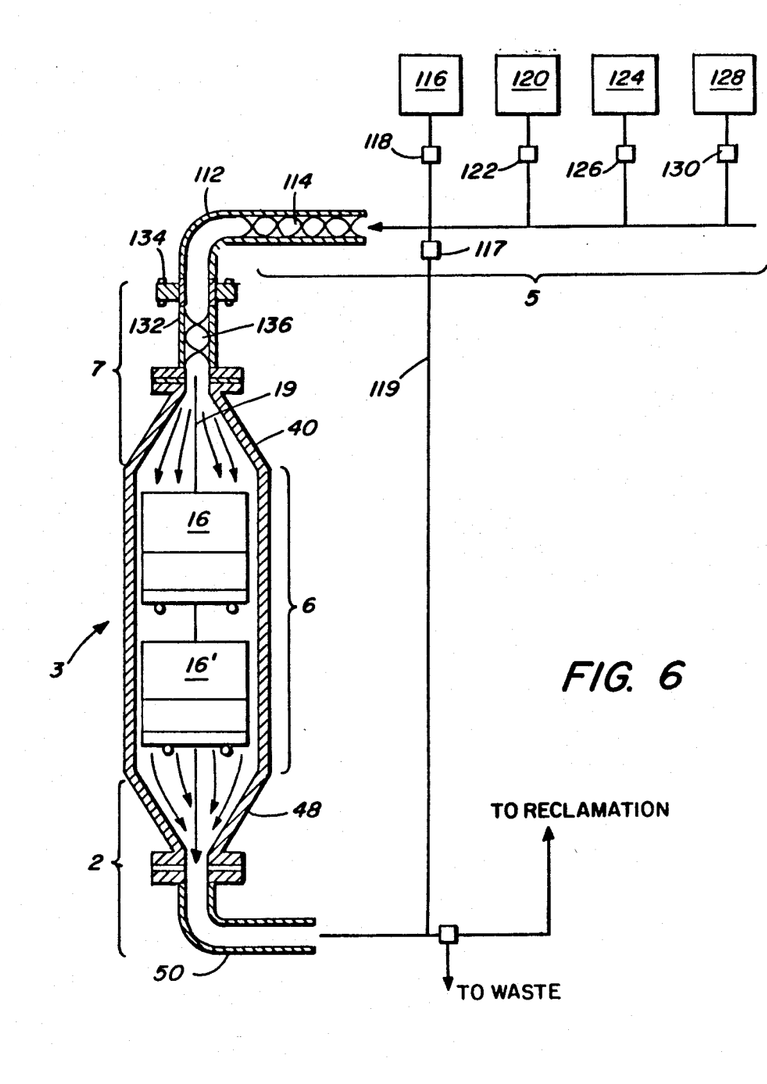
FIG. 6 is a schematic cross-sectional illustration of an embodiment of a system of the invention including an exemplary treatment station comprising a two-compartment vessel constructed in accordance with the invention.

The embodiments of the vessel of the invention shown if FIGS. 1 and 2, after being loaded with wafer carriers containing wafers, are used singly or engage with other vessels as shown in FIG. 1C, and then connected to an expander and extractor as illustrated in FIG. 6 to form fluid-tight seals between the various mating parts. This step may conveniently be accomplished by means of a hydralic or pneumatic press (not shown) which holds the vessels in compression during processing of the wafers. After processing, the press serves to gently separate the vessel or vessels from their connection with the expander, extractor, and fluid flow lines to permit removal of the vessel and unloading of the wafer carriers.

Figure 3:
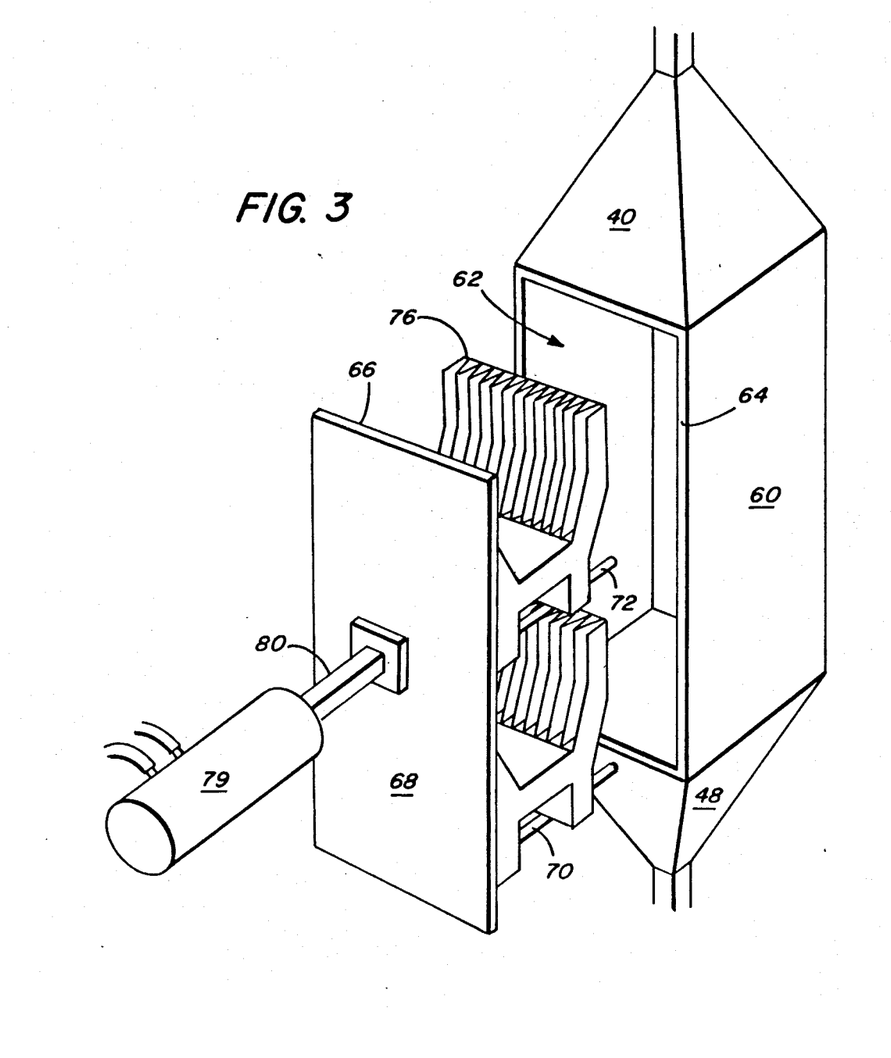
FIG. 3 is a perspective view of a third embodiment of the invention illustrating an expander and extractor connected to a fluid flow line and to a two-compartment vessel having a panel fitted with wafer carrier supports.

FIG. 3 schematically illustrates still another alternative design for the wafer vessels. The design of FIG. 3 comprises an enclosure 60 defining a compartment for holding wafer carriers. The enclosure is made integral with an expander 40 and an extractor 48. One side of the enclosure defines an opening 62 having a sealing surface 64 which interfits with a seal 66 on a panel 68. The panel is fitted with two pairs of wafer carrier support bars 70 and 72 extending perpendicular to its interior face. Conventional wafer carriers, illustrated schematically at 76, 78, are nested on the support bars when loaded with wafers to be treated, and the panel is then sealed to opening 62 of enclosure 60 by means of hydraulic cylinder 79 and piston 80. Preferably, the interior of enclosure 60 or the panel includes structure (not shown) for nesting the wafer carriers 76 and 78 in a selected location and orientation within the enclosure 60.

Figure 4:
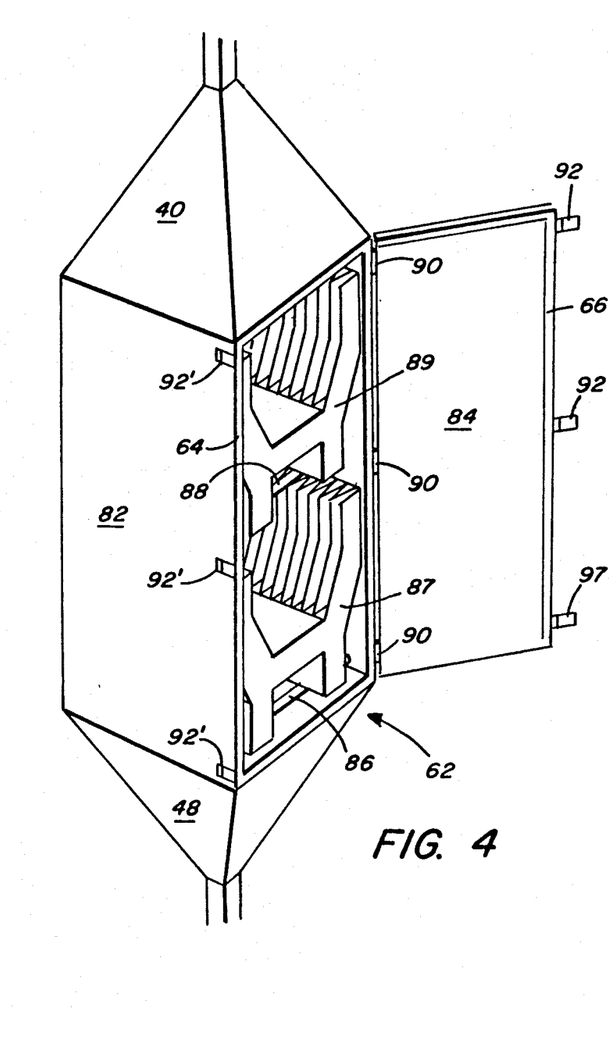
FIG. 4 is a perspective view of a fourth embodiment of the vessel of the invention showing two wafer carriers disposed therein.

FIG. 4 depicts another embodiment of a suitable wafer vessel for use in the method and apparatus of the invention. It comprises an enclosure 82, again integrally connected to an expander 40 and extractor 48, having a sealable door 84 and internal structure, e.g., support bars 86, 88, for supporting and locating wafer carriers 87, 89 within structure 82. Hinges 90 join door 84 to enclosure 82. Fasteners 92, 92' serve to seal door 84 shut and to press seal 66 on door 84 into interfitting, fluid-tight engagement with sealing surface 64.

Both of the foregoing structures have advantages in that wafer carriers of the type now commonly in use may be used to handle the wafers, and there is no need to assemble the vessels and place them in engagement with fluid input and outlet lines.

Figure 5:
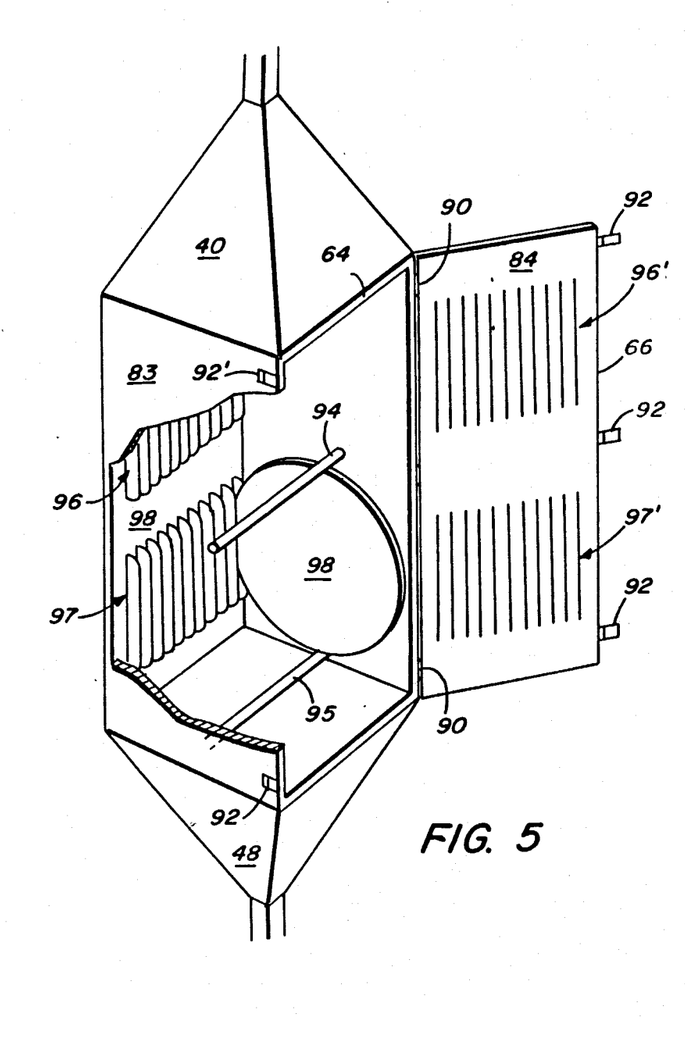
FIG. 5 is a perspective, partly broken-away view of a fifth embodiment of the invention similar to that of FIG. 4, but adapted to receive plural individual wafers instead of a wafer carrier.

FIG. 5 illustrates another embodiment of the invention, similar to the embodiment of FIG. 4, except that the vessel 83 of FIG. 5 is adapted to receive plural individual wafers instead of a loaded wafer carrier. The vessel 83 includes single wafer support bars 94 and 95, two series of wafer-receiving grooves 96, 97 formed integrally with wall 98 of vessel 83, and two series of matching grooves 96', 97' disposed on the interior surface of door 84. Typically, 25 grooves will be provided. These structures cooperate to hold a plurality, e.g., 50 wafers (one illustrated at 98) in parallel array within vessel 83. Wafers to be processed are loaded into vessel 83 manually or robotically, and when door 84 is sealed, the wafers are supported by bars 94 and 95 and held in position with their face planes parallel to the axis of flow from expander 40 to extractor 48 (or vice versa).

Various materials may be used to costruct the vessels of the invention. One preferred type of material is fluoropolymer such as poly-tetrafluoroethylene (sold under the trademark "Teflon" by E. I. duPont de Nemours and Company of Wilmington, Del.). The vessels should in any case be constructed from a material which is as impervious and inert as possible to the reagents used in the treatment process and as insensitive as possible to any temperature changes during treatment. The sealing gaskets likewise are designed to be able to withstand temperatures up to 150° C. or higher and to be insensitive to the chemicals used in the treatment process. Suitable gasket materials include fluorinated elastomers such as "Kalrez" and "Viton", both of which are manufactured by E. I. duPont de Nemours and Company of Wilmington, Del. Preferably, as shown in FIG. 1C, the gaskets are arranged so that they form a slightly convex surface inside the vessel upon compression. It is also preferred that no adhesives be used to fix the gaskets in position.

Various changes and modifications can be made to the design of the vessels themselves. Although the lateral walls are shown as flat in the illustrated embodiments, rounded walls or non-planar walls, e.g., cylinders, may be preferred in particular applications to achieve more even flow paths around the end wafers or for other purposes. Likewise, the groove designs or structure for supporting and/or positioning wafer carriers may be varied to optimize the flow characteristics, and the actual dimensions of the grooves will vary with the size of the wafers treated. Other support structures can be also designed by those skilled in the art. In most instances, all dimensions, the number of wafers per vessel, etc., will conform to standards set by the Semiconductor Equipment and Materials Institute as set forth in its annual *Book of SEMI Standards*.

The beveled or chamfered edges shown in the illustrated embodiment may be replaced by various other interlocking or interfitting geometries. The beveled edges are preferred because of the ease of handling in automated operations and protection from dirt or particulates which may be encountered when the vessels are placed on work surfaces. Likewise, various seal arrangements and fastening means may be used to seal a panel or door to the vessels.

The materials of construction as well as the fabrication techniques can also be varied by those skilled in the art. Although fluorinated polymers are preferred for at least interior surfaces of the vessels, various other inert plastics, metals or ceramics may be substituted depending upon the intended use. The vessels may be fabricated by machining, molding, or casting.

An important design constraint is the avoidance of eddy currents on the inside of the vessel walls and the avoidance of traps for fluid. Excellent results are achieved using the vessels and system of the invention because a controlled volume of a fluid of defined, exact, and reproducible composition is flowed through the vessels about the wafers and in contact with the walls along the flow path. The reagents used are of the highest purity. Eddy currents caused by flow restrictions which might result in concentrating effects should accordingly be avoided. Likewise, cracks, concavities, and blind openings of any kind should be avoided.

FIG. 6 illustrates in cross-section an embodiment of the invention which can treat plural batches of wafers so as to obtain the effects disclosed above. Broadly, the system 3 comprises a treatment liquid supply section 5, a liquid input element 7, a pair of wafer vessels 6, and a treatment fluid outlet section 2.

The schematically illustrated, exemplary treatment fluid supply section 5 comprises elements permitting relative introduction of homogeneous treatment fluids to the wafer vessels 6. In particular, the supply section 5 includes a treatment fluid supply line 112 containing a conventional static mixer 114 which is fed by a plurality of alternately useable reservoirs of fluid. The fluid reservoirs can include, for example, a reservoir 116 of hot sulfuric acid and an associated valve 118, a reservoir 120 of pressurized nitrogen and associated valve 122, a reservoir 124 of an etchent, e.g., hydrofluoric acid, and its associated valve 126, and a reservoir 128 of ultrapure water and an associated valve 130. Sulfuric acid may be passed through valve 117 and line 119 for purposes hereinafter disclosed. It is contemplated that HF and ultrapure water may be mixed in line, and that a homogeneous solution of controlled HF concentration be supplied to the wafer vessels 6 through the action of static mixer 114. It should be understood that the arrangement and design of the illustrated fluid supply section are not per se a part of the invention.

The fluid input element 7 comprises a section of tubing 132 mated with supply line 112 by means of connector 134. Disposed within tubing 132 is a fixed, helical, flow-diverting surface 136 disposed 360° about an axis 19 extending in the direction of fluid flow. A flow expander 40 serves to increase the area of fluid flow transverse to the direction of axis 19. The flow diverting surface 136, in combination with the expander 40, serves to impart plug flow to liquids introduced into wafer vessels 6 which are to displace a liquid the vessels already contain. Thus, helical surface 136 imparts to liquids passing therealong a flow vector transverse to axis 19. This has the effect of widening the front surface of liquid flow as the expander is filled. Liquid contained in the vessel is accordingly displaced as a wave or front defined by the interface zone of the newly introduced and the displaced liquid. If the two liquids are miscible, as the front advances mixing occurs within a disc-shaped volume which gets thicker as displacement continues. However, for a given flow rate and a given pair of liquids, the transition is reproducible from batch to batch and results in all radial surfaces of all wafers being exposed to substantially the same amount of active solute or the same rinsing action for the same amount of time.

In one embodiment of the invention, the helical flow-diverting surface 136 is disposed within tubing 132 such that its longitudinal axis is aligned with the fluid flow axis 19. The descending pitch and surface pitch will vary for each set of flow conditions (i.e., flow rate, viscosity and vessel geometry), however, one skilled in the relevant art can empirically determine the optimal pitches for any given system. The helical surface of element 136 is preferably rotated at least 360° about the longitudinal axis. The length of the element 136 may be 3.5 inches; and the radius may be 1.25 inches. The tubing 132 in which element 136 resides may have an inside diameter of 1.375 inches.

The illustrated vessels 6, which correspond to the structure of FIG. 1, may be replaced by any one of the various vessel embodiments shown in FIGS. 2, 3, 4, or 5 or other vessels embodying the invention. Thus, wafer carriers 16, 16' may be omitted, and wafers may be placed individually in the vessels as shown, for example, in FIG. 5.

The illustrated treatment fluid outlet section 2 includes extractor 48 and tubing 50 which directs fluid to waste or to apparatus (not shown) for reclamation and subsequent reuse of the treatment fluid. Under certain conditions, tubing 50 and extractor 48 may be used to fill vessels 6 with fluid.

In operation, by way of example, wafers may be cleaned and etched thoroughly and reproducibly in preparation for diffusion by sequential contact with hot sulfuric acid, ultrapure water, a hydrofluoric acid etch solution, an ultrapure water rinse, and a drying reagent. These reagents are introduced into the vessels 6 through suitable piping and valving which, per se, form no part of this invention. At the outset, sulfuric acid from reservoir 116 is introduced into the vessels through the extractor 48 and thereafter circulated through the vessels in contact with the wafers. Ozone or another oxidizing agent may be injected into the acid effluent to oxidize impurities. The acid may be removed by introducing from reservoir 120 pressurized nitrogen through the input element 7. Thereafter, ultrapure water from reservoir 128 is circulated through the vessels to remove acid residues from the wafer surfaces and the insides of the wafer vessels and associated piping.

At a point when the rinse effluent from the vessels has a high resistivity and low particle count, indicating that thorough rinsing has been completed, hydrofluoric acid from reservoir 124 is injected into the flow of ultrapure water to produce an HF solution of precisely defined concentration. The water and hydrofluoric acid are thoroughly mixed as they pass through pipe 112 by static mixer 114. As the leading edge of the HF solution exiting mixer 114 displaces water, a certain amount of mixing occurs. As the acid solution passes through helical flow diverting surface 136, it receives a flow vector transverse to the direction of liquid flow indicated by axis 19. In fluid mechanics terminology, the flow diverting surface 136 imparts angular momentum to the HF solution.

As the HF solution enters expander 40, the angular momentum of the liquid is converted by centrifugal force into lateral momentum. Thus the liquid front tends to expand to fill the increasing cross-sectional area of the expander 40 resulting in an increase in the area of the HF solution-water interface zone. At the point where the fluid begins passing the wafers, most of the rotational velocity has dissipated, and a front defined by the wafer-HF solution interface zone passes through the vessels with a minimum of turbulent flow. Finally, as the front passes through extractor 48, the vessels are filled with a flow of HF solution which uniformly contacts all radial wafer surfaces and the interior walls of the vessels.

The etching stage is terminated at a selected time by abruptly ending HF injection while continuing to circulate ultrapure water. The front defined by the trailing edge of the HF solution and the leading edge of the pure water passes through the vessels, again as a plug flow, because of the combined action of the flow diverting surface 136 and the expander 40.

Because of the plug flow characteristics of the fronts produced on the introduction of the HF solution and the subsequent introduction of pure water, all wafers in a given batch and all wafers in sequential batches receive substantially the same effective exposure to the HF etch solution.

Thereafter, water circulation is continued until the resistivity and particle count of the effluent indicates rinsing is complete. At this point, the water is flushed out with nitrogen from reservoir 120. The wafers and interior surfaces of the vessels and associated piping may then be dried, for example, by introduction of a hot organic vapor such as methanol, and subsequently displacing the organic vapor with dry nitrogen or other suitable gas.

The wafers may then be removed from the vessels for further processing. This may be done by disassembling the apparatus and removing the wafers individually or the wafer carrier from the vessel if the embodiment of FIGS. 1 or 2 is employed. If a vessel such as shown in FIGS. 3, 4, or 5 is used, the wafers or wafer carriers may be removed by opening the access panel or door.

It will be clear to those skilled in the art that various changes or adaptations of the invention may be made for particular uses. For example, the system may be used in various other treatment steps besides prediffusion cleaning. Thus the invention can be used in wet processes generally, such as photoresist developing, wet etching and photoresist stripping. Other applications might include diffusion, oxidation, reduction, and sputtering. The apparatus may also be used to dry wafers, e.g., by alcohol treatment.

Accordingly, other embodiments are within the following claims.

What is claimed is:

1. Apparatus comprising
   A. a fluid flow line;
   B. a treatment station comprising:
      i. lateral walls disposed about a vertical axis along which fluids from said fluid flow line pass;
      ii. a plurality of planar semiconductor wafers disposed within said walls;
      iii. a sealable opening to permit the introduction and removal of said semiconductor wafers, and
      iv. closure means for sealing engagement with said sealable opening;
   C. a first inlet disposed beneath said treatment station for passing a semiconductor wafer treatment liquid from a first portion of said fluid flow line upwardly along a portion of said axis and about said wafers disposed within said walls; and
   D. means for passing a fluid from a second portion of said fluid flow line downwardly along a portion of said axis about said wafers.

2. The apparatus of claim 1 wherein said first inlet comprises an expander for minimizing eddy current flow within said treatment station.

3. The apparatus of claim 1 wherein said means for passing fluid downwardly comprises an expander for minimizing eddy current flow within said treatment station.

4. The apparatus of claim 1 further comprising means for imparting plug flow to a liquid passed through said treatment station to displace another liquid diposed therein.

5. The apparatus of claim 1 further comprising means for feeding a gas or a hot organic vapor from said second portion of said fluid flow line downwardly along said axis about said wafers.

* * * * *